United States Patent [19]
Nessi

[11] Patent Number: 5,469,094
[45] Date of Patent: Nov. 21, 1995

[54] POWER TRANSISTOR DRIVER STAGE WITH OPTIMALLY REDUCED TURN-OFF DELAY

[75] Inventor: Maurizio Nessi, Como, Italy

[73] Assignee: SGS-Thomson Microelectronics, S.r.l., Agrate Brianza, Italy

[21] Appl. No.: 251,699

[22] Filed: May 31, 1994

[30] Foreign Application Priority Data

May 31, 1993 [EP] European Pat. Off. .............. 93830246

[51] Int. Cl.$^6$ ................................................ H03B 1/00
[52] U.S. Cl. ............................................ 327/110; 327/108
[58] Field of Search ..................................... 327/108, 109, 327/110, 388, 359, 427

[56] References Cited

U.S. PATENT DOCUMENTS 5,157,351  10/1992  Carobolante ............................ 330/277
5,194,760  3/1993   Braun et al. ............................ 327/110
5,204,562  4/1993   Pace ....................................... 307/571

FOREIGN PATENT DOCUMENTS 493185  1/1992  France .

Primary Examiner—Timothy P. Callahan
Assistant Examiner—Jeffrey Zweizig
Attorney, Agent, or Firm—Robert Groover; Betty Formby

[57] ABSTRACT

A fast-discharge switch is controlled by a comparator sensing the voltage difference between the output node and the input node of a driving integrator stage that controls the slew-rate of a power switching output transistor. The fast-discharge switch turns off automatically when the output power transistor reaches (in the case of a MOS transistor) or exits (in the case of a bipolar transistor) saturation. The circuit of the invention accelerates the discharge thus reducing the turn-off delay and is insensitive of load conditions and does not affect the performance of the integrating (driver) stage that control the slew-rate.

21 Claims, 2 Drawing Sheets

POWER TRANSISTOR DRIVER STAGE WITH OPTIMALLY REDUCED TURN-OFF DELAY

CROSS-REFERENCE TO RELATED APPLICATION

This application claims priority from European App'n 93830246.0, filed May 31, 1993, which is hereby incorporated by reference.

BACKGROUND OF AND SUMMARY OF THE INVENTION

This invention regards slew-rate control of output power transistors in general, and the reduction of turn-off delay in particular.

In inductive load drive systems, as those of a DC brushless motor, for example, it is necessary to limit induced disturbances, to minimize both electromagnetic emissions and also noise on power supply lines. Usually, specific circuits for controlling output power transistor slew-rates are used for this purpose.

Slew-rate control is usually implemented by the use of an integrating stage to prevent discontinuities in the load current characteristic so as to drive the output power transistor, as shown in FIG. 1. In this sample circuit, a driving signal DRIVE is fed to an input node A of the integrating stage, which consists of a buffer B1, a feedback capacitor C and a discharge generator I(slew).

The use of such an integrating circuit has several drawbacks. In particular, it should be noted that, when the ratio I(slew)/C (V/μsec) is small, the time taken by output power transistor MP to exit the linear zone and enter the saturation zone of its characteristic, during turn-off, may be too long, and may consequently cause a switching delay that, under certain circumstances, may not be tolerated by the system as a whole.

In order to avoid such a drawback, recourse is commonly made to circuits that permit an "accelerated" slew-rate during an initial phase of a turn-off process, before allowing the discharge to continue with an adequately greater time constant (as determined by the integrating stage), in order to curb disturbances.

An example of such known accelerating circuits is schematically shown in FIG. 2. A logic control signal CONTROL_IN is applied to the control terminal of a discharging current generator M1. At the instant t1, when the turn-off of the output power transistor MP is started, the transistor M1 (which may or may not be under current control) is switched-on. This makes the gate of the output power transistor MP to quickly discharge until the input node A of the integrating stage reaches the threshold set by the diode D1 (which may also be replaced by several diodes in series, by a MOS diode, or by another threshold device, as needed). At this point, the contribution to the discharge current provided by the transistor (generator) M1 ceases, and the turn-off process of the MP output power transistor thus continues with a time constant as set by the values I(slew) and C of the slew-rate control, integrating stage. One of the drawbacks of these known solutions is that they rely on a preset threshold to determine the moment at which the discharge generator M1 is switched-off.

Moreover, since it is notorious that the biasing conditions of an output power transistor (MP) strongly depend on load characteristics (e.g. the electrical parameters of the driven inductive load, the working conditions of the driven motor, etc.), it often becomes impossible to set an optimal threshold value when designing the circuit.

Depending on operating conditions, either this difficulty or the approximate character of even the most accurate design choice may often result in failing to optimize switching delay or in an inadequate performance of the slew-rate control circuit. In particular, a retarded turn-off of the M1 switch would make the slew-rate equal to I(M1)/C and, since of course I(M1)>I(slew), the actual slew-rate would be much higher than desired.

An innovative system has now been found which is capable of effectively reducing the turn-off delay of an output power transistor. The system of the invention utilizes a slew-rate control circuit which, unlike known circuits, is capable of adjusting to changing load conditions.

Basically, the turn-off delay reduction circuit employs a "comparator" that senses the potential difference between the output node of the power stage and the input node of a slew-rate control integrating circuit. The comparator produces, on an output node of the comparator, a signal that indicates the state of saturation or of non-saturation of the output power transistor, during a turn-off process. This signal, produced by the comparator, is used to enable and disable the transfer of the driving logic signal IN to the control terminal of the discharge switch of the input node of the integrating stage that drives the output power transistor.

Therefore, the comparator acts as a "sensor", indicating the instant when the output power transistor (preferably a field effect transistor or a bipolar transistor) passes from a "linear" operating zone to a "saturation" zone of its characteristic during a turnoff phase, irrespectively of varying load conditions. Thus, the turn-off delay reduction circuit, object of this invention, exploits a variable and intrinsically optimized threshold for reducing the turn-off delay without affecting the function of the slew-rate control integrating circuit in case of varying load conditions.

According to a disclosed class of innovative embodiments, there is provided: A circuit for driving a power transistor which has a control terminal and two current-carrying terminals, comprising: a first current generator connected to drive a first node, said first node being operatively connected to drive the control terminal of the power transistor; an additional current generator operatively connected, through a respective pass transistor, to drive said first node with a current of the same sign as, and greater magnitude than, the current provided by said first current generator, when said pass transistor is turned on; and a comparator operatively connected to detect the voltage difference between said first node and a current-carrying terminal of the power transistor, and to selectively enable or disable said additional current generator.

According to another disclosed class of innovative embodiments, there is provided: A circuit for driving a power transistor which has a control terminal and two current-carrying terminals, comprising: a first current generator connected to drive a first node, said first node being operatively connected to drive the control terminal of the power transistor; a sensing transistor having a first current-carrying terminal thereof connected to one of the current-carrying terminals of the power transistor, and a control terminal thereof connected to said first node, and a second current-carrying terminal thereof connected to a second current generator; an additional current generator operatively connected, through a respective pass transistor, to drive said first node with a current of the same sign as, and greater magnitude than, the current provided by said first current generator, when said pass transistor is turned on; and logic circuitry connected to drive said pass transistor in dependence on the voltage of said second current-carrying terminal of said sensing transistor.

According to another disclosed class of innovative embodiments, there is provided: A circuit for reducing the turn-off delay of an output power transistor of an output stage comprising: an integrating stage for controlling slew-rate, having an input node driven by a discharge acceleration circuit that consists essentially of a fast discharge switch that can be turned-on by a control signal and turned-off when the potential on the aforesaid input node drops below a certain threshold value, a comparator sensing the potential difference between an output node of the output power stage and said input node of the integrating stage and capable of producing a signal indicative of when the output power transistor reaches or exits saturation during a turn-off phase; and a logic gate having a first input to which said control signal is fed, a second input to which said comparator-produced signal is fed, and an output which is dependent on the logical product of said inputs and is operatively connected to a control terminal of said fast discharge switch; said control signal being transferred to the control terminal of said fast discharge switch when the output power transistor reaches or exits saturation during a turn-off phase.

According to another disclosed class of innovative embodiments, there is provided: A method, implemented in integrated circuit hardware, for turning off a power transistor, comprising the steps of: using a first current generator, driving a first node which is operatively connected to drive a control terminal of the power transistor; in a comparator, detecting the voltage difference between said first node and a current-carrying terminal of the power transistor, and providing an output accordingly; and using said output of said comparator to selectively enable or disable an additional current generator operatively connected to drive said first node with a current of the same sign as, and greater magnitude than, the current provided by said first current generator, when said pass transistor is turned on.

BRIEF DESCRIPTION OF THE DRAWING

The disclosed inventions will be described with reference to the accompanying drawings, which show important sample embodiments of the invention and which are incorporated in the specification hereof by reference, wherein.

The different aspects and advantages of this invention will become more evident through the description of an important embodiment, herein incorporated by express reference.

DETAILED DESCRIPTION

Figure 1:
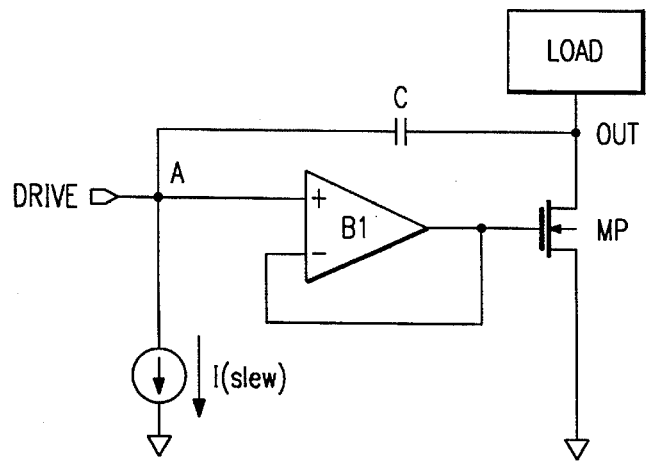
FIG. 1 (described above) shows an output stage comprising a slew-rate control integrating circuit, according to the prior art, as already mentioned.
Figure 2:
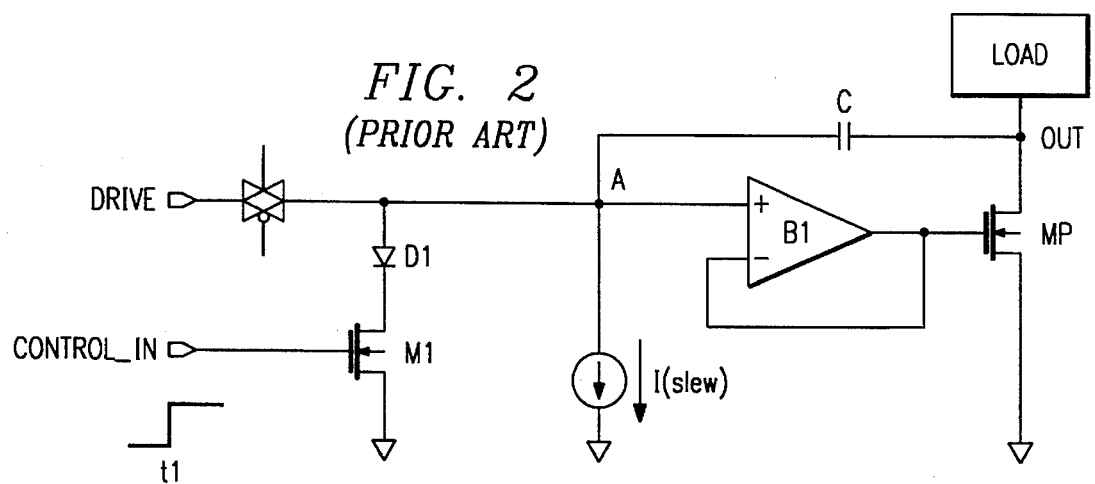
FIG. 2 (described above) shows a circuit diagram of an output stage provided with a turn-off delay reduction circuit according to a known technique, as described above.
Figure 3:
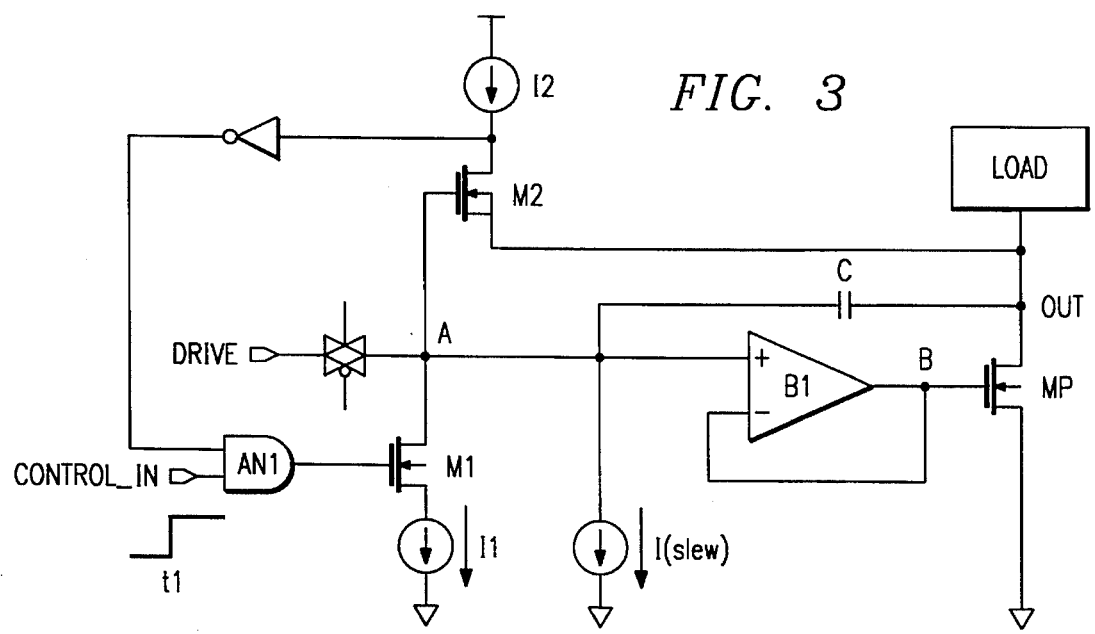
FIG. 3 shows a circuit diagram of an output stage with a variable threshold, turn-off delay reduction circuit, according to the present invention.

The numerous innovative teachings of the present application will be described with particular reference to the presently preferred embodiment (by way of example, and not of limitation), in which:

FIG. 3 shows a circuit diagram of an output stage with a variable threshold, turn-off delay reduction circuit, according to a sample embodiment of the present invention. The node A is where the driving signal DRIVE (e.g. an analog signal) is input. The driving signal may be applied through a transmission gate (as shown) that would be controlled in phase-opposition with M1, in dependence on the actual state of the motor.

With reference to FIG. 3, it should be noted that a suitable comparator is realized by the transistor M2 and the biasing generator I2. This comparator senses the potential difference between the output node OUT of the power stage and the input node A of the slew-rate control integrating stage, which is made up of the buffer B1, the feedback capacitor C and the current generator I(slew).

A switch M1 and a discharge current generator I1 form a functional discharge acceleration circuit capable of reducing the turn-off delay of the output power transistor MP, in accordance with the present invention.

The signal on the output node of the M2-I1 comparator acts as an enable/disable signal for transferring a logic driving signal from the input terminal CONTROL_IN to the control terminal of the M1 switch.

The illustrated circuit works as follows.

When the output power transistor MP is on, nodes A and B are at the input voltage, whereas the drain of the power transistor MP (i.e. the output node OUT of the circuit) will have roughly the ground potential.

The power transistor MP turns-off as follows.

At the instant t1, the control signal, present on the input terminal IN, is transferred through the AND gate AN1 to the control terminal of the transistor M1, bringing it into conduction. The node A will start to discharge through the transistor M1 with a discharge current set by the generator I1.

The discharge of the node A causes a drop in the gate voltage of the transistor MP as well as of the sensing transistor M2. As a consequence, the drain of the power transistor MP (that is the potential on the output node OUT) tends to rise owing to an increase of the resistivity of the power transistor MP.

The sensing transistor M2 will switch-off when the voltage on node A reaches a value equivalent to the sum of the threshold voltage of the sensing transistor M2 and of the voltage drop across the power transistor MP ($Vth_{M2}$+ $Vds_{Mp2}$). Therefore, by assuming that the threshold voltage values of the transistors MP and M2 are substantially correlated, the transistor M2 switches-off when the output power transistor MP reaches saturation. Of course in the case of a bipolar power transistor, the M2 would switch-off when the output power transistor exits saturation.

The turn-off of the M2 transistor produces a logic zero on the output of the AND gate AN1, which switches off the discharge switch M1 thus returning, from then on, the control of the slew-rate of the power transistor MP to the slew-rate control stage, according to its preset time constant (I/C).

Thus it may be seen that the circuit of the instant invention achieves the aim of making the effect of the turn-off delay reduction circuit perfectly and automatically adjustable to the real load conditions, without interfering with the performance of the integrating stage that controls the slew-rate.

Figure 4:
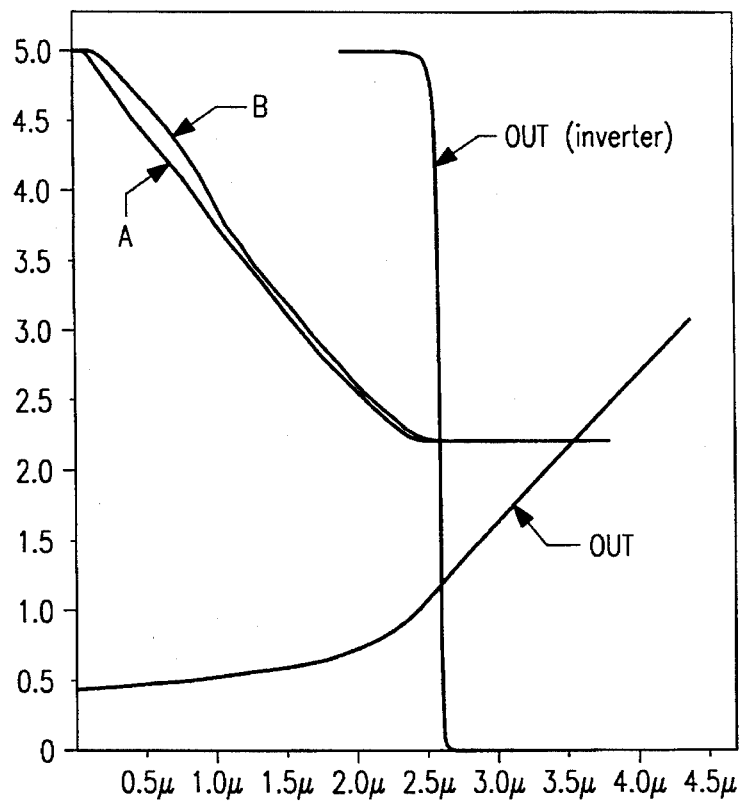
FIG. 4 shows time-domain measurements of a circuit like that of FIG. 3 during turn-off.

FIG. 4 shows time-domain measurements of a circuit like that of FIG. 3 during turn-off.

Figure 5:
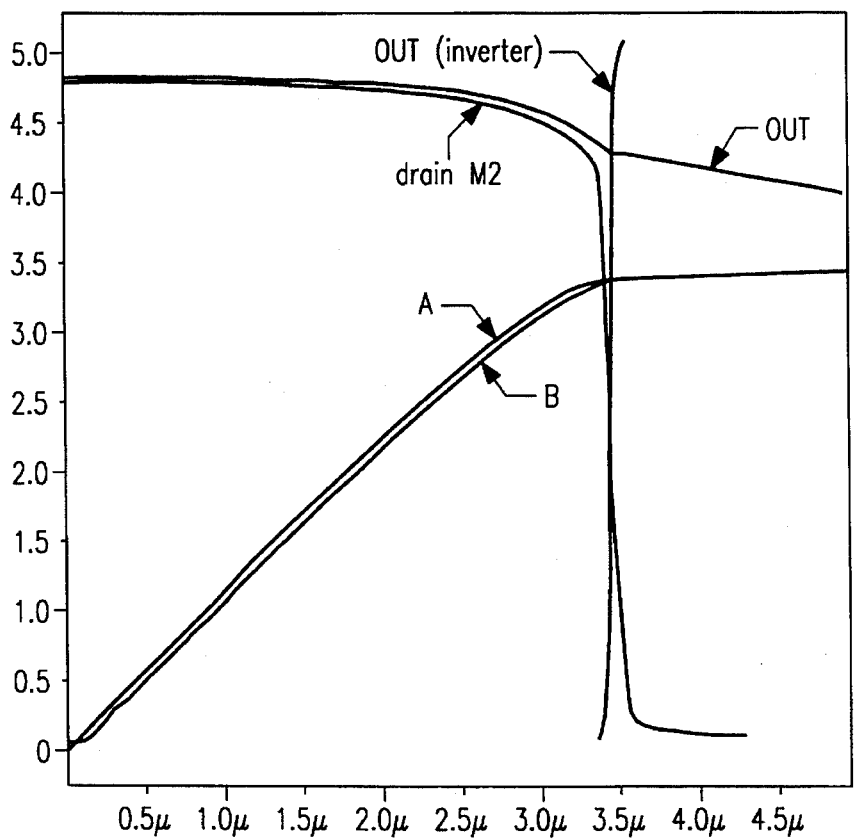
FIG. 5 shows time-domain measurements of a circuit which is dual to that of FIG. 3, used for controlling turn-off of a P-channel power transistor.

FIG. 5 shows time-domain measurements of a circuit which is dual to that of FIG. 3, used for controlling turn-off of a P-channel power transistor.

Of course, the scope of the disclosed innovations is not necessarily limited to the embodiments described above. For example, the innovative concepts can be implemented in a circuit which also includes turn-on control. (Turn-on control would normally be implemented by driving the output stage with a ramp instead of with a step signal, and would require additional circuitry besides the turn-off control means object of the present invention. In many applications (e.g. motor drives), a control of the turn-on characteristic is not required.

For another example, the current sink I1 can also be gated by some form of the input signal, to reduce power consumption.

For another example, other circuit configurations can be used instead to implement the comparator operation.

For another example, the disclosed innovations can also be applied to driving different types of power device, e.g. a bipolar transistor or IGBT. (However, in the case of a bipolar transistor, the base voltage is intrinsically clamped to one $V_{BE}$, and therefore the problem would not be as severe as in the case of a FET driven at e.g. 12 V.)

What is claimed is:

1. A circuit for driving a power transistor which has a control terminal and two current-carrying terminals, comprising:

a first current generator connected to drive a first node, said first node being operatively connected to drive the control terminal of the power transistor;

an additional current generator operatively connected, through a respective pass transistor, to drive said first node with a current of the same sign as, and greater magnitude than, the current provided by said first current generator, when said pass transistor is turned on; and a comparator operatively connected to detect the voltage difference between said first node and a current-carrying terminal of the power transistor, and to selectively enable or disable said additional current generator.

2. The circuit of claim 1, wherein said power transistor is a field-effect transistor.

3. The circuit of claim 1, wherein said power transistor is an N-channel field-effect transistor.

4. The circuit of claim 1, further comprising circuitry for producing a controlled ramp of gate voltage of said power transistor at turn-on.

5. The circuit of claim 1, wherein said comparator consists of a single field-effect transistor in combination with a current source and a logic gate.

6. The circuit of claim 1, wherein said power transistor is a field-effect transistor, and said comparator consists of a single field-effect sensing transistor in combination with a current source and a logic gate, and said sensing transistor has the same conductivity type as said power transistor.

7. A circuit for driving a power transistor which has a control terminal and two current-carrying terminals, comprising:

a first current generator connected to drive a first node, said first node being operatively connected to drive the control terminal of the power transistor;

a sensing transistor having a first current-carrying terminal thereof connected to one of the current-carrying terminals of the power transistor, and a control terminal thereof connected to said first node, and a second current-carrying terminal thereof connected to a second current generator;

an additional current generator operatively connected, through a respective pass transistor, to drive said first node with a current of the same sign as, and greater magnitude than, the current provided by said first current generator, when said pass transistor is turned on; and logic circuitry connected to drive said pass transistor in dependence on the voltage of said second current-carrying terminal of said sensing transistor.

8. The circuit of claim 7, wherein said power transistor is a field-effect transistor.

9. The circuit of claim 7, wherein said power transistor is an N-channel field-effect transistor.

10. The circuit of claim 7, further comprising circuitry for producing a controlled ramp of gate voltage of said power transistor at turn-on.

11. The circuit of claim 7, wherein said power transistor is a field-effect transistor, and said sensing transistor has the same conductivity type as said power transistor.

12. A circuit for reducing the turn-off delay of an output power transistor of an output stage comprising:

an integrating stage for controlling slew-rate, having an input node driven by a discharge acceleration circuit that consists essentially of a fast discharge switch that can be turned-on by a control signal and turned-off when the potential on the aforesaid input node drops below a certain threshold value, a comparator sensing the potential difference between an output node of the output power stage and said input node of the integrating stage and capable of producing a signal indicative of when the output power transistor reaches or exits saturation during a turn-off phase; and a logic gate having a first input to which said control signal is fed, a second input to which said comparator-produced signal is fed, and an output which is dependent on the logical product of said inputs and is operatively connected to a control terminal of said fast discharge switch;

said control signal being transferred to the control terminal of said fast discharge switch when the output power transistor reaches or exits saturation during a turn-off phase.

13. The circuit of claim 12, wherein said comparator is made up of a transistor having a first control terminal connected to the input node of said integrating circuit driving the output power transistor, a second terminal being connected to the output node, and a third terminal being connected to a supply node through biasing means; the signal present on the said second terminal being fed to the first input of said AND gate through an inverter.

14. The circuit of claim 13, wherein said transistor making up said comparator is of the same type of said power transistor.

15. The circuit of claim 12, wherein said output power transistor is a MOS transistor and said comparator produces a signal indicative of the power transistor reaching saturation, during a turn-off phase.

16. The circuit of claim 12, wherein said output power transistor is a bipolar transistor and said comparator produces a signal indicative of the power transistor exiting saturation, during a turn-off phase.

17. A method, implemented in integrated circuit hardware, for turning off a power transistor, comprising the steps of:

(a.) using a first current generator, driving a first node which is operatively connected to drive a control terminal of the power transistor;

(b.) in a comparator, detecting the voltage difference between said first node and a current-carrying terminal of the power transistor, and providing an output accordingly; and (c.) using said output of said comparator to selectively enable or disable an additional current generator operatively connected to drive said first node with a current of the same sign as, and greater magnitude than, the current provided by said first current generator, when said pass transistor is turned on.

18. The method of claim 17, wherein said comparator consists of a single field-effect transistor in combination with a current source and a logic gate.

19. The method of claim 17, wherein said power transistor is a field-effect transistor, and said comparator consists of a single field-effect transistor, having the same conduction type as the power transistor, in combination with a current source and a logic gate.

20. The method of claim 17, wherein said power transistor is a field-effect transistor.

21. The method of claim 17, wherein said power transistor is an N-channel field-effect transistor.

* * * * *